(12) United States Patent
Brooks

(10) Patent No.: US 7,098,068 B2
(45) Date of Patent: Aug. 29, 2006

(54) METHOD OF FORMING A CHALCOGENIDE MATERIAL CONTAINING DEVICE

(75) Inventor: Joseph F. Brooks, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 10/796,109

(22) Filed: Mar. 10, 2004

(65) Prior Publication Data

US 2005/0202588 A1    Sep. 15, 2005

(51) Int. Cl.
   *H01L 21/00* (2006.01)
(52) U.S. Cl. .......................................... 438/95; 438/102
(58) Field of Classification Search ................. 257/3; 438/95, 102
   See application file for complete search history.

(56) References Cited

U.S. PATENT DOCUMENTS

| | | | |
|---|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |

(Continued)

FOREIGN PATENT DOCUMENTS

WO    56126916    10/1981

(Continued)

OTHER PUBLICATIONS

Wolf and Tauber, "Silicon Processing for the VLSI Era", vol. I, Chapters 12 and 15, Lattice Press, 1986.*

(Continued)

*Primary Examiner*—Asok Kumar Sarkar
(74) *Attorney, Agent, or Firm*—Dickstein Shapiro Morin & Oshinsky LLP

(57) ABSTRACT

Embodiments of the invention provide a method of forming a chalcogenide material containing device, and particularly resistance variable memory elements. A stack of one or more layers is formed over a substrate. The stack includes a layer of chalcogenide material and a metal, e.g., silver, containing layer. A protective layer is formed over the stack. The protective layer blocks light, is conductive, and is etchable with the other layers of the stack. Further, the metal of the metal containing layer is substantially insoluble in the protective layer. The stack and the protective layer are then patterned and etched to form memory elements.

45 Claims, 6 Drawing Sheets

U.S. PATENT DOCUMENTS

| | | |
|---|---|---|
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,804,490 A | 2/1989 | Pryor et al. |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 4,920,078 A | 4/1990 | Bagley et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A * | 5/1994 | Kozicki et al. ............... 430/14 |
| 5,315,131 A | 5/1994 | Kishimoto et al. |
| 5,330,630 A | 7/1994 | Klersy et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,837,564 A | 11/1998 | Sandhu et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,086,796 A * | 7/2000 | Brown et al. ............... 264/1.33 |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Hudgens et al. |
| 6,511,862 B1 | 1/2003 | Hudgens et al. |
| 6,511,867 B1 | 1/2003 | Lowrey et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowrey et al. |
| 6,555,860 B1 | 4/2003 | Lowrey et al. |
| 6,563,164 B1 | 5/2003 | Lowrey et al. |
| 6,566,700 B1 | 5/2003 | Xu |
| 6,567,293 B1 | 5/2003 | Lowrey et al. |
| 6,569,705 B1 | 5/2003 | Chiang et al. |
| 6,570,784 B1 | 5/2003 | Lowrey |
| 6,576,921 B1 | 6/2003 | Lowrey |
| 6,586,761 B1 | 7/2003 | Lowrey |
| 6,589,714 B1 | 7/2003 | Maimon et al. |
| 6,590,807 B1 | 7/2003 | Lowrey |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowrey et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowrey et al. |
| 6,671,710 B1 | 12/2003 | Ovshinsky et al. |
| 6,673,700 B1 | 1/2004 | Dennison et al. |
| 6,674,115 B1 | 1/2004 | Hudgens et al. |
| 6,687,153 B1 | 2/2004 | Lowrey |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 2002/0000666 A1 | 1/2002 | Kozicki et al. |
| 2002/0072188 A1 | 6/2002 | Gilton |

| | | |
|---|---|---|
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |
| 2005/0162883 A1* | 7/2005 | Nejad et al. ................ 365/63 |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

Adler, D.; Moss, S.C., Amorphous memories and bistable switches, J. Vac.Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcodenide glass system Se75Ge25-xSbx, Appl. Phys. A 55 (1992) 167-169.

Afifi, M.A.; Labib, H.H.; Fouad,A.A.; Electrical & thermal conductivity of the amorphous semiconductor $Ge_xSe_{1-x}$, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.: Prasad, M.V.N.; Parthasarathy, G.; Gopal, E.S.R., Mechanical and chemical thresholds in IV-VI chalcogenide glasses, Phys. Rev. Lett. 62 (1989) 808-810.

Axon Technologies corporation, Technology Description: *Programmable Metalization Cell(PMC)*, pp. 1-6 (Pre May 2000).

Banarnovskii, S.D.; Cordes, H., On the conducrion mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2000) 445-455.

Benmore, C.J.; Salmon, P.S., Structure of fast ion conducting and semiconducting glassy chalcogenide alloys, Phys. Rev. Left. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in $Ge_xSe_{1-x}$ Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiter, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in $Ge_xSe_{1-x}$ glasses, Solid state comm. 45 (1983) 183-185.

Boolchand, P.; Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K,; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffuses amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Y.; Yang, P.; Xia, Y., Single-crystalline nanowires of Ag2Se can be synthesized by templating against nanowires of trigonal Se, J. Am. Chem. Soc. (2001) currently ASAP.

Gossain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, touchness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 404-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H.; Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., Intralevel hybrid resist process with submicron capability, SPIE vol. 333 SUBMICRON LITHOGRAPHY, pp. 24-29 (1982).

Hilt, DISSERTATION: Materials characterization of Silver Chalcogenide Programmable Metalization Cells, Arizona State University, pp. Title p. 114 (UMI Company, May 1999).

Hirose et al., High Speed Memory Behavior and Reliability of an Amorphous $As_2S_3$ Film Doped Ag, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J.Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto,.J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2-V2O5 based glasses, Journal de Physique IV 2 (1992) C2-185—C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkiva, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and Ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagama, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phrase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. SOl. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J. ;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G. ;Owen,A.E., Aspects of non-volatility in a -Si:H memory devices, Mat. Res. Soc. Symp. Proc. V258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses,* 46 B. Chem Soc. Japan, No. 12, pp. 3662-3665 (1973).

Snell, A.J.; Lecomber, P.G.; Hajto, J.; Rose, M.J.; Owen, A.E.; Osborne, I.L., Analogue memory effects in meta/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D., White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H. ;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

* cited by examiner

METHOD OF FORMING A CHALCOGENIDE MATERIAL CONTAINING DEVICE

FIELD OF THE INVENTION

The invention relates to the field of random access memory (RAM) devices formed using a resistance variable material, and in particular to an improved method of manufacturing a resistance variable memory element.

BACKGROUND OF THE INVENTION

A well known semiconductor memory component is a random access memory (RAM). RAM permits repeated read and write operations on memory elements. Typically, RAM devices are volatile, in that stored data is lost once the power source is disconnected or removed. Non-limiting examples of RAM devices include dynamic random access memory (DRAM), synchronous dynamic random access memory (SDRAM), and static random access memory (SRAM). DRAMS and SDRAMS typically store data in capacitors which require periodic refreshing to maintain the stored data. Although volatile, SRAMS do not require refreshing.

Recently, resistance variable memory elements, which include programmable conductor memory elements, have been investigated for suitability as semi-volatile and non-volatile random access memory elements. Generally, a programmable conductor memory element includes an insulating dielectric material formed of a chalcogenide glass disposed between two electrodes. A conductive material, such as silver, is incorporated into the dielectric material. The resistance of the dielectric material can be changed between high resistance and low resistance states depending upon movement of the conductive material within or into and out of the dielectric material in accordance with applied voltage.

One preferred resistance variable material comprises a chalcogenide glass, for example, a $Ge_xSe_{100-x}$ glass. One method of forming a resistance variable memory element using chalcogenide glass includes blanket forming a lower electrode over a substrate, forming one or more layers of chalcogenide glass and one or more metal, e.g., silver, containing layers over the lower electrode, and forming an upper electrode over the stack of layers. Photolithographic and etching processes are conducted to form etched stacks, each forming a resistance variable memory element. Current methods that employ these processes present various drawbacks.

Typical etch chemistries produce inherent sidewalls of chemical compounds on the stack of layers. The wet scrub used to remove the etch sidewalls has been known to scratch the stack surface or remove the top layer of the stack entirely, decreasing device functionality. Problems are also encountered in removing the photoresist used to pattern the structures. Such problems include residual organic material and material loss from the stack. Stack material is lost because photo developers containing Tetramethylammonium Hydroxide (TMAH) etch away the stack material. Typically, when structures or devices do not conform to desired specifications, a rework is performed to make the nonconforming structures/devices conform to the desired specifications. Photolithographic rework is a form of rework that includes photolithographic processes. Due to the material loss, however, photolithographic rework is not always possible.

Further, dry etching has not been a suitable process. Exposure to dry etch or dry strip plasmas are known to cause silver to migrate out of the stack, which can result in a "racetrack" defect. FIG. 1 illustrates a memory array 10, which has the "racetrack" defect. The memory elements in the periphery or "racetrack" portion 14 of the array 10 are affected by silver migration during the dry etch, whereas the center memory elements 12 are unaffected. It is believed that the silver migration is caused by light exposure during the etch process. It is desirable to eliminate the racetrack defect.

It is desirable to have an improved method of fabricating a resistance variable memory element, which addresses one or more of the above disadvantages of conventional photolithographic and etching processes.

BRIEF SUMMARY OF THE INVENTION

Embodiments of the invention provide a method of forming a chalcogenide material containing device, and particularly resistance variable memory elements. A stack of one or more layers is formed over a substrate. The stack includes a layer of chalcogenide material and a metal, e.g., silver, containing layer. A protective layer is formed over the stack. The protective layer blocks light, is conductive, and is etchable with the other layers of the stack. Further, the metal of the metal containing layer is substantially insoluble in the protective layer. The stack and the protective layer are then patterned and etched to form memory elements.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
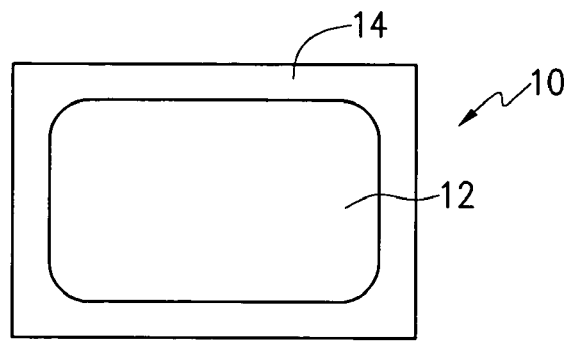
FIG. 1 illustrates a conventional memory array.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but can be any support structure suitable for supporting an integrated circuit. For example, the substrate can be ceramic or polymer-based.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "resistance variable memory element" is intended to include any memory element, including Programmable Conductive Random Access Memory (PCRAM) elements, which exhibit a resistance change in response to an applied voltage.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

Embodiments of the invention provide a method of forming a chalcogenide material containing device, such as, and without limitation, a resistance variable memory element, that does not suffer from the drawbacks associated with conventional fabrication methods. One or more layers including a layer of chalcogenide material and a metal containing layer are formed over a substrate. The chalcogenide material layer and the metal containing layer can be a same layer. A protective layer is formed over the layer(s). The protective layer blocks light, is conductive, and is etchable with the other layers of the stack. Further, the metal of the metal containing layer is substantially insoluble in the protective layer. The chalcogenide material and metal containing layer(s) and the protective layer can be patterned and etched using conventional photolithographic and etching techniques without the above described disadvantages. Accordingly, photolithographic rework can be more readily performed on resulting structures.

Specific exemplary embodiments of the invention are now explained with reference to the figures, where like reference numbers indicate like features. Although the exemplary embodiments described herein refer to the formation of only one resistance variable memory element 200, it must be understood that the invention contemplates the formation of any number of such resistance variable memory elements, which can be fabricated in a memory array and operated with memory element access circuits.

Figure 2:
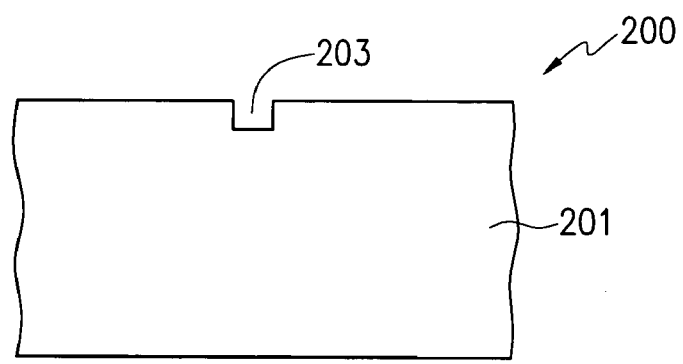
FIG. 2 illustrates cross-sectional views of a memory element fabricated in accordance with an exemplary embodiment of the invention and at an initial stage of processing.
Figure 3:
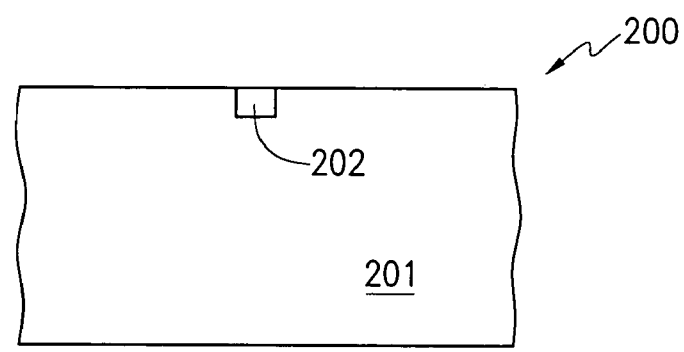
FIGS. 3–8 illustrate cross-sectional views of the memory element of FIG. 2 at intermediate stages of processing.

FIGS. 2–8 show an exemplary processing sequence for forming a resistance variable memory element 200 according to an exemplary embodiment of the invention. Referring to FIG. 2, a via 203 is etched in a substrate 201 by any suitable techniques. A first electrode 202 is formed in the via 203, as illustrated in FIG. 3. The first electrode 202 may comprise any conductive material, for example, tungsten, nickel, tantalum, aluminum, platinum, conductive nitrides, and other materials. The first conductive layer is planarized to the surface of the substrate 201.

Figure 4:
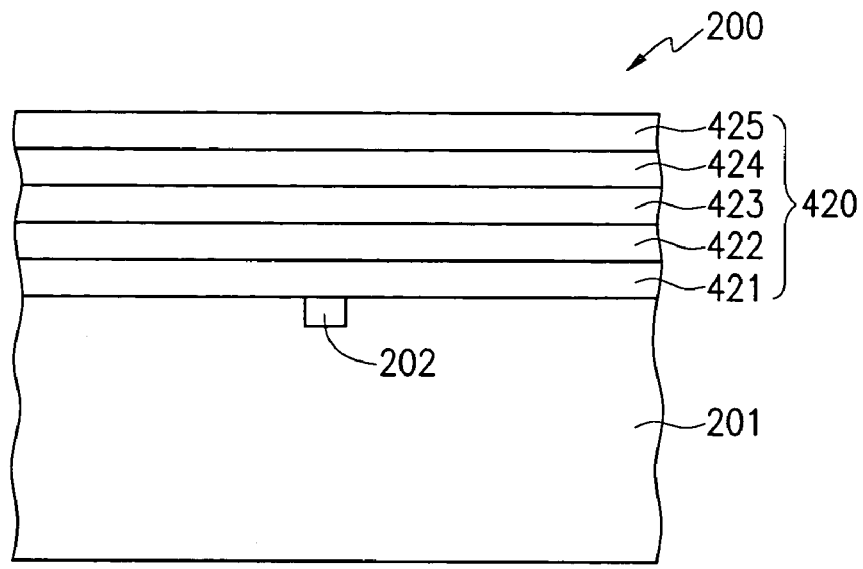

A stack 420 of layers 421, 422, 423, 424, 425 is sequentially formed over the substrate 201 and the first electrode 202, as shown in FIG. 4. The stack 420 of layers 421, 422, 423, 424, 425 is exemplary and it should be understood that the memory element 200 can have a different layer structure and can include additional or fewer layers than those illustrated.

Layer 421 is a first chalcogenide glass layer, and can be germanium-selenide glass having a $Ge_xSe_{100-x}$ stoichiometry. It is desired that the stoichiometric range is between approximately $Ge_{20}Se_{80}$ to approximately $Ge_{43}Se_{57}$ and preferably approximately $Ge_{40}Se_{60}$. The first chalcogenide glass layer 421 can have a thickness of approximately 100 Å to approximately 1000 Å and is preferably approximately 150 Å.

The formation of the first chalcogenide glass layer 421 can be accomplished by any suitable method. For instance, germanium-selenide glass can be formed by evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry.

Layer 422 is a metal containing layer and can be directly deposited on the surface of the first chalcogenide glass layer 421. When the metal containing layer 422 is a silver-selenide layer rather than a metal layer, such as a silver layer, doping the chalcogenide glass layer 421 by photodoping or thermal diffuision is unnecessary to induce silver migration into the chalcogenide glass layer 421. However, doping the chalcogenide glass layer 421 with a metal (e.g., silver) is an optional variant.

The metal containing layer 422 can be any suitable metal containing layer which can supply metal into the chalcogenide glass layer 421. Suitable metal containing layers include silver-chalcogenide layers, such as silver-sulfide, silver-oxide, silver-telluride, and silver-selenide. A variety of processes can be used to form the metal containing layer 422, which is preferably silver-selenide. For instance, physical vapor deposition techniques such as evaporative deposition and sputtering may be used. Other processes such as chemical vapor deposition, co-evaporation, or deposition of a layer of selenium above a layer of silver to form a silver-selenide layer can also be used.

It is desired that the thickness of the metal containing layer 422 is such that a ratio of the metal containing layer 422 thickness to the first chalcogenide glass layer 421 thicknesses is between approximately 5:1 and approximately 1:1. In other words, the thickness of the metal containing layer 422 is between approximately 1 to approximately 5 times greater than the thickness of the first chalcogenide glass layer 421. Preferably, the ratio is between approximately 3.1:1 and approximately 2:1. In the exemplary embodiment of FIG. 4, layer 421 is approximately 150 Angstroms (Å) thick and layer 422 is approximately 470 Å thick (i.e., ratio of 3.1:1).

A second glass layer 423 is formed over the first metal containing layer 422. When the metal containing layer is silver-selenide, the second glass layer 423 allows deposition of silver above the silver-selenide layer, while preventing agglomeration of silver on the surface of the silver-selenide.

The second glass layer 423 may also act as a silver diffusion control layer or an adhesion layer. For use as a diffusion control layer, any suitable glass may be used, including but not limited to chalcogenide glasses. Illustratively, the second chalcogenide glass layer 423 has the same stoichiometric composition as the first chalcogenide glass layer, e.g., $Ge_xSe_{100-x}$. The second glass layer 423, however, can be of a different material, have a different stoichiometry, and/or be more rigid than the first chalcogenide glass layer 421. When used as a diffusion control layer, the second glass layer 423 can comprise SiSe (silicon-selenide), AsSe (arsenic-selenide, such as $As_3Se_2$), GeS (germanium-sulfide), and combinations of Ge, Ag, and Se. Any one of these suitable glass materials can further comprise small concentrations, e.g., less than approximately 3%, of dopants to include nitrides, metal, and other group 13–16 elements from the periodic table.

The thickness of the layers 422, 423 are such that the metal containing layer 422 thickness is greater than the thickness of the second glass layer 423. It is desired that a ratio of the metal containing layer 422 thickness to the second glass layer 423 thickness is between approximately 5:1 and approximately 1:1. Preferably, the ratio of the metal containing layer 422 thickness the second glass layer 423 thickness is between approximately 3.3:1 and approximately 2:1. The second glass layer 423 preferably has a thickness between approximately 100 Å to approximately 1000 Å. In the exemplary embodiment of FIG. 4, layer 423 has a thickness of approximately 150 Å. The second glass layer 423 can be formed by any suitable method. For example, by chemical vapor deposition, evaporation, co-sputtering, or sputtering using a target having the desired stoichiometry.

A silver layer 424 is formed above the second chalcogenide glass layer 423. The silver layer 424 may be deposited over the second glass layer 423 by any suitable means, such as sputtering or plating techniques, including electroplating or electroless plating. In the illustrated embodiment, the thickness of the silver layer 424 is illustratively approximately 200 Å.

Figure 5:
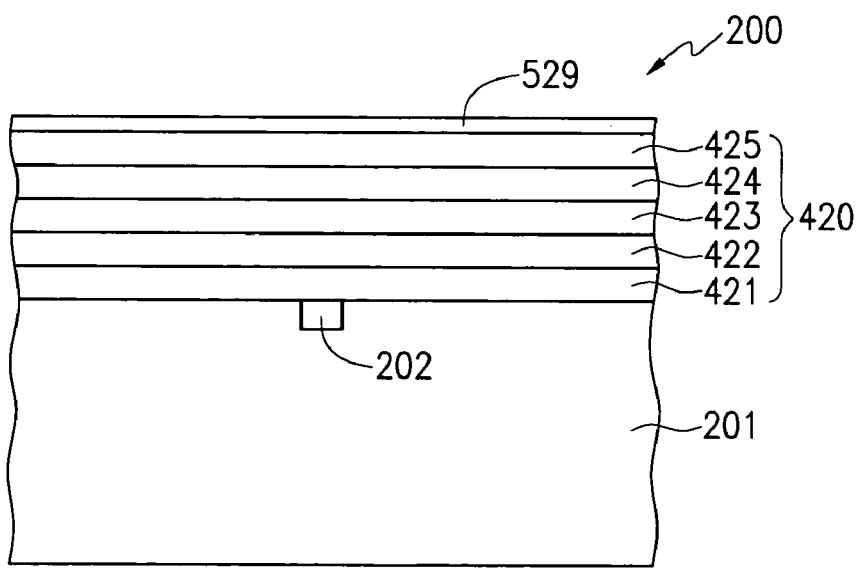

A conductive adhesion layer 425 is formed over the silver layer 424. Suitable materials for the conductive adhesion layer 425 include conductive materials capable of providing good adhesion between the silver layer 424 and a protective layer 529 (FIG. 5). Desirable materials for the conductive adhesion layer 425 include chalcogenide glasses. The conductive adhesion layer 425 may be the same chalcogenide glass material used in the first and second chalcogenide glass layers 421, 423 discussed above. The thickness of the chalcogenide glass conductive adhesion layer 425 is illustratively approximately 100 Å.

In the exemplary embodiment of FIG. 4, during the formation and processing of the memory element 200, silver diffuses into layers 423 and 425. This results in layers 423–425 comprising $Ge_xSe_{100-x}Ag_y$. For simplicity purposes only, however, these layers are shown individually in each of FIGS. 4–10.

Referring to FIG. 5, the protective layer 529 is formed over the conductive adhesion layer 425 to a thickness between approximately 50 Å and approximately 500 Å. The protective layer 529 comprises a conductive material in which the metal, e.g., silver, of metal containing layer 422 is not soluble. It should be noted, however, that processes used to form protective layer 529 (e.g., sputtering) can result in silver in the protective layer 529. The protective layer 529 also blocks light and is etchable. Illustratively, protective layer 529 is a layer of tungsten. Alternatively, protective layer 529 can be a composite tungsten/tantalum nitride layer. The protective layer 529 can be formed by any suitable techniques.

Figure 6:
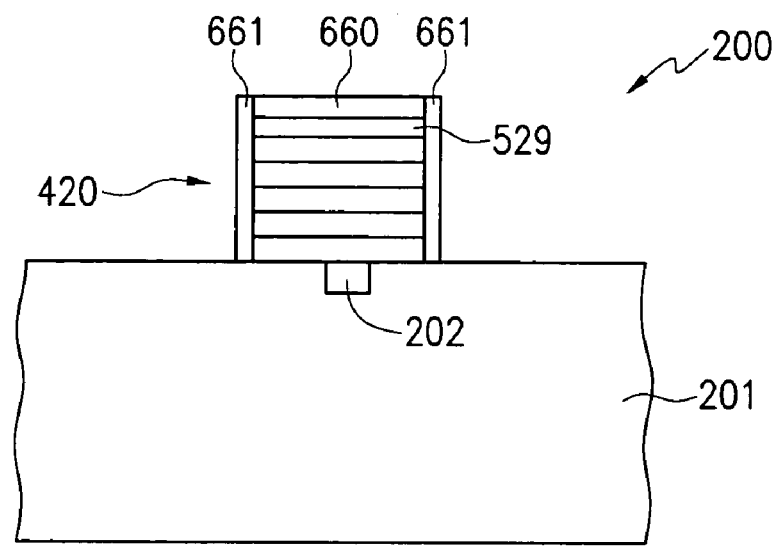

The protective layer 529 and stack 420 are patterned and etched using standard photolithographic and etching techniques to form a pillar structure, as shown in FIG. 6. A photoresist layer 660 is formed over the protective layer 529. Portions of the photoresist layer 660 are exposed to light and developed to remove the exposed portions (not shown) and form a desired pattern of photoresist on the protective layer 529. For this process, a photo developer containing TMAH can be used.

The protective layer 529 and stack 420 are then etched. Suitable etching techniques can include a halogen containing reactive ion etch (RIE) process or an argon (Ar) sputter etch process. For example, when the protective layer 529 is greater than approximately 100 Å, the protective layer 529 can be etched using a halogen containing RIE process, and the stack 420 can be etched using an Ar sputter etch process. When the metal layer thickness is less than approximately 100 Å, the protective layer 529 and the stack 420 can be etched using an Ar sputter etch process.

Figure 7:
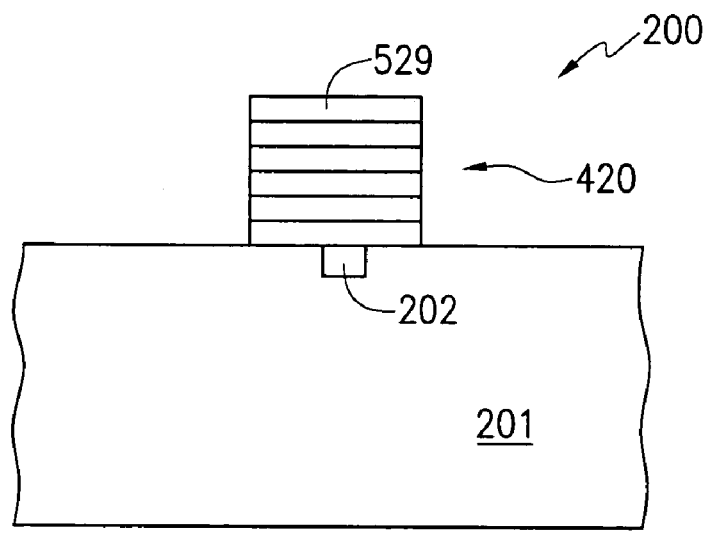

As shown in FIG. 6, the etching process results in sidewalls 661 on the sides of the stack 420. After the protective layer 529 and the stack 420 are etched, the photoresist 660 and sidewalls 661 are removed, for example, by using a wet acid process or a dry strip process, as shown in FIG. 7. To remove the photoresist 660 and sidewalls 661, a scrub step can also be conducted.

The protective layer 529 protects the layers 421–425 from scrubber damage during photoresist 660 and sidewall 661 removal. Additionally, because photoresist 660 does not directly contact layer 425, it can be more easily removed. For example, photoresist 660 does not adhere well to tungsten, and where the protective layer 529 is tungsten, the photoresist 660 is easily removed. Further, the protective layer 529 protects the layers 421–425 from the TMAH containing photo developer. This results in less material loss and enables photolithographic rework. The protective layer 529 also decreases dry etch induced defects in the stack 420 by decreasing the exposure of the layers 421–425 to the plasma. Further, because the protective layer 529 blocks light, the racetrack defect (FIG. 1) is avoided. Therefore, the method according to the invention does not suffer from the drawbacks associated with conventional fabrication methods.

Figure 8:
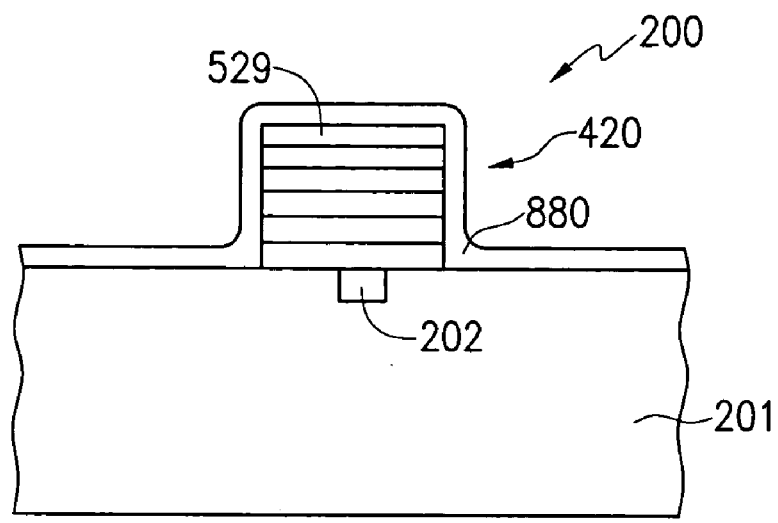

Referring to FIG. 8, a second (top) electrode 880 is formed over the stack 420 and protective layer 529. Since the metal, e.g., silver, of metal containing layer 422 is not soluble in the protective layer 529, the protective layer 529 serves to keep silver out of the electrode 880. Illustratively, the second electrode 880 is a common electrode and can be shared among a plurality of memory elements (not shown). The second electrode 880 can be any conductive material, such as tungsten, nickel, tantalum, aluminum, platinum, silver, conductive nitrides, and others. The second electrode 880 is preferably tungsten or tantalum nitride.

Figure 9:
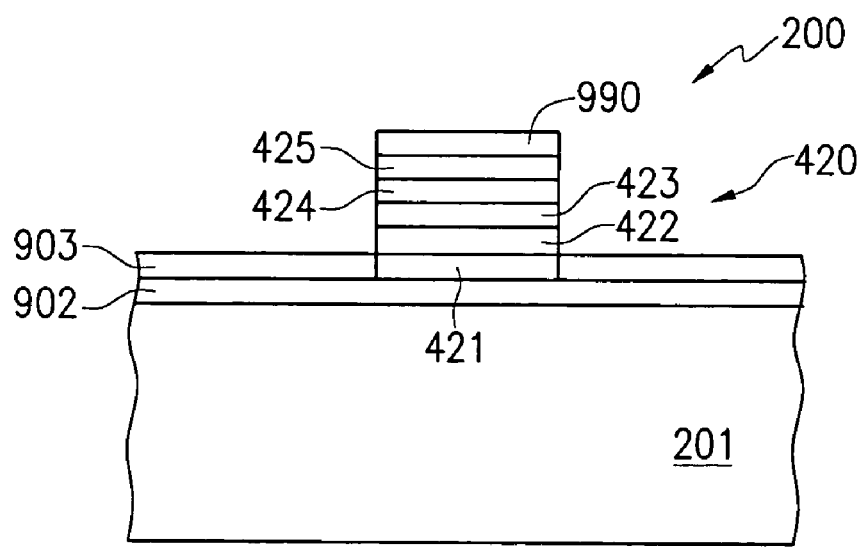
FIG. 9 illustrates a cross-sectional view of a memory element in accordance with another exemplary embodiment of the invention.

In an alternative exemplary embodiment, the memory element 200 can include a common first (bottom) electrode 902, instead of a common second electrode, as shown in FIG. 9. In such a case, an optional insulating layer (not shown) can be formed over the substrate 201. The optional insulating layer can be formed by any known deposition methods, such as sputtering by chemical vapor deposition (CVD), plasma enhanced CVD (PECVD) or physical vapor deposition (PVD). The optional insulating layer can be formed of a conventional insulating oxide, such as silicon oxide ($SiO_2$), a silicon nitride ($Si_3N_4$), or a low dielectric constant material, among many others.

Figure 10:
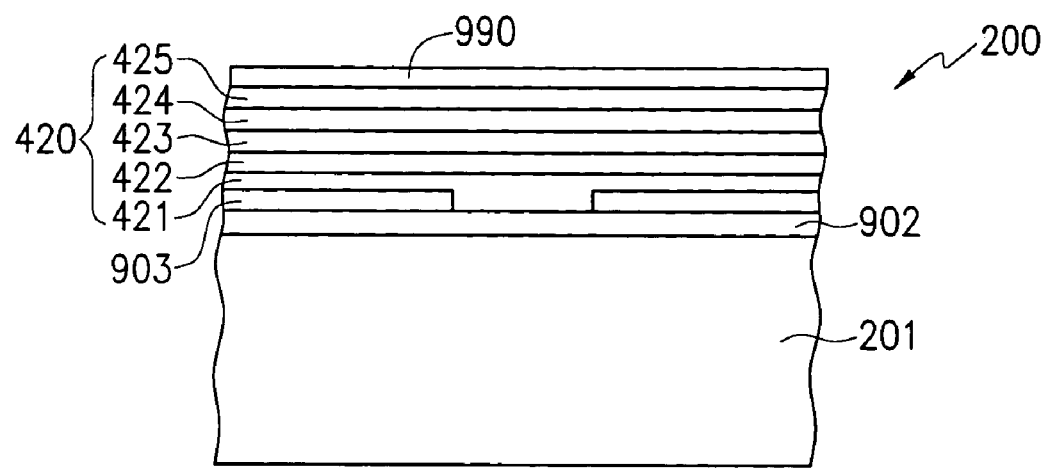
FIG. 10 illustrates a cross-sectional view of the memory element of FIG. 9 at an initial stage of processing.

A first electrode 902 is formed over the substrate 201, as shown in FIG. 10. The first electrode 902 may comprise any conductive material, for example, tungsten, nickel, tantalum, aluminum, platinum, conductive nitrides, and other materials. A dielectric layer 903 is formed over the first electrode 902. The dielectric layer 903 can comprise the same or different materials as those described above for the optional insulating layer.

An opening (not shown) extending to the first electrode 902 is formed in the first dielectric layer 903. The opening can be formed by known methods in the art, for example, by a conventional patterning and etching process. A stack 420 comprising layers 421, 422, 423, 424, and 425 is formed over the first electrode 902 as described above in connection with FIGS. 4–8. Instead, however, of a protective layer 529, a second electrode 990 is formed over the stack 420. The second electrode 990 is formed of the same material as is suitable for protective layer 529. Accordingly, the second electrode 990 comprises a conductive material which blocks light, is etchable, and is a material in which the metal of layer 422, e.g., silver, is not soluble. By forming the second electrode 990 of such a material, the benefits described above in connection with FIGS. 6 and 7 can be realized. Illustratively, second electrode 990 is tungsten. Alternatively, second electrode 990 can be a composite layer of tungsten and tantalum nitride.

The stack 420 and second electrode 990 can be patterned and etched as described above in connection with FIGS. 6–7 to form a memory element 200 having the structure shown in FIG. 9.

Figure 11:
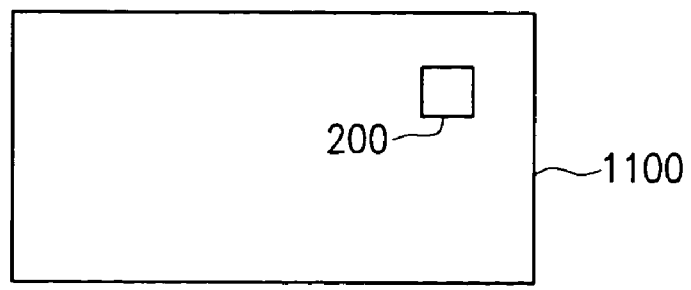
FIG. 11 illustrates a memory array having a memory element in accordance with the invention.

Referring to FIG. 11, a memory element 200 in accordance with the invention can be included in a memory array 1100. In turn, the memory array 1100 can be included in a memory device 1248 and used in a processor based system 1200, depicted in FIG. 12.

Figure 12:
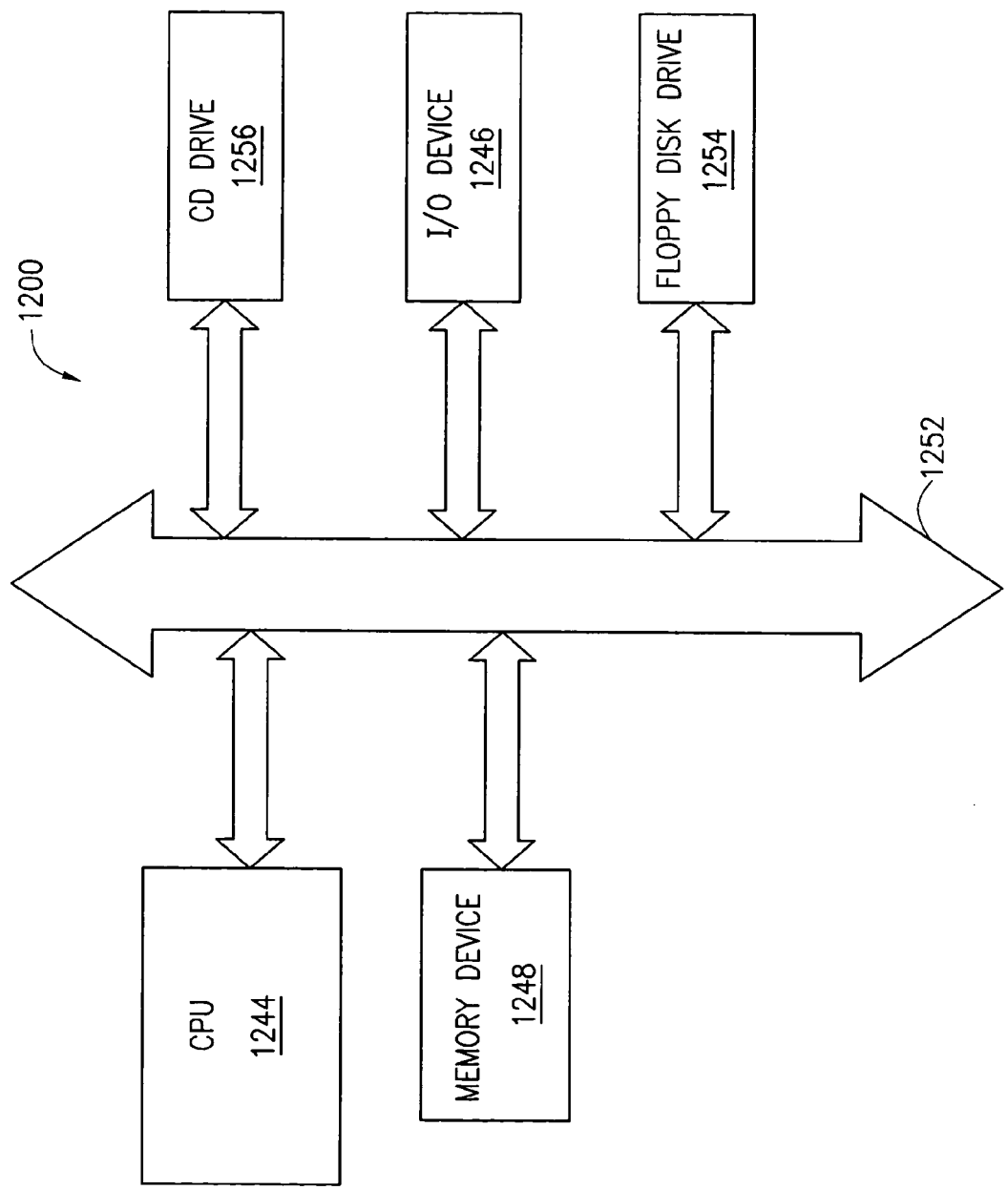
FIG. 12 illustrates a computer system including the memory array of FIG. 11.

FIG. 12 is a block diagram of a processor-based system 1200 which includes a memory circuit 1248, for example a programmable conductor RAM employing resistance variable memory elements 200 fabricated in accordance with the invention. The processor system 1200, such as a computer system, generally comprises a central processing unit (CPU) 1244, such as a microprocessor, a digital signal processor, or other programmable digital logic devices, which communicates with an input/output (I/O) device 1246 over a bus 1252. The memory 1248 communicates with the system over bus 1252 typically through a memory controller.

In the case of a computer system, the processor system may include peripheral devices such as a floppy disk drive 1254 and a compact disc (CD) ROM drive 1256, which also communicate with CPU 1244 over the bus 1252. Memory 1248 is preferably constructed as an integrated circuit, which includes one or more resistance variable memory elements 200. If desired, the memory 1248 may be combined with the processor, for example CPU 1244, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming a chalcogenide material containing device, the method comprising the acts of:
    forming a stack of one or more layers over a substrate, the stack including at least one layer of chalcogenide material and at least one metal containing layer;
    forming a protective layer over the stack, the protective layer blocking light, being conductive, and being etchable with the other layers of the stack, the metal of the metal containing layer being substantially insoluble in the protective layer;
    patterning the stack and the protective layer; and
    subsequently etching each layer of the stack and the protective layer.

2. The method of claim 1, wherein the metal containing layer comprises silver.

3. The method of claim 1, wherein the act of patterning the stack comprises forming and photo patterning a layer of photoresist on the protective layer.

4. The method of claim 3, wherein the act of patterning the stack comprises exposing the photoresist to a TMAH containing photo developer.

5. The method of claim 3, further comprising the act of removing the photoresist using a wet acid process.

6. The method of claim 3, further comprising the act of removing the photoresist using a dry strip process.

7. The method of claim 3, further comprising the act of removing the photoresist using a scrub process.

8. The method of claim 1, further comprising the act of performing photolithographic rework subsequent to the act of etching.

9. The method of claim 1, wherein the act of forming the protective layer comprises forming a layer of tungsten.

10. The method of claim 1, wherein the act of forming the protective layer comprises forming a composite layer of tungsten/tantalum nitride.

11. The method of claim 1, wherein the act of forming the protective layer comprises forming the protective layer having a thickness between approximately 50 Å to approximately 500 Å.

12. The method of claim 1, wherein the act of forming the protective layer comprises forming the protective layer having a thickness between approximately 50 Å to approximately 100 Å.

13. The method of claim 1, wherein the act of etching comprises performing a halogen containing reactive ion etch process.

14. The method of claim 1, wherein the act of etching comprises performing an argon sputter etch process.

15. The method of claim 1, wherein the metal containing layer and the chalcogenide material layer are a same layer.

16. A method of fabricating resistance variable memory elements, the method comprising:
    forming a first electrode over a substrate;
    forming a stack of one or more layers over the first electrode, the stack comprising at least one layer of chalcogenide glass and at least one metal containing layer;
    forming a protective layer over the stack, the protective layer blocking light, being conductive, and being etchable when etching the stack, the metal of the metal containing layer being substantially insoluble in the protective layer;
    patterning the stack and the protective layer; and
    subsequently etching each layer of the stack and the protective layer.

17. The method of claim 16, wherein the metal containing layer comprises silver.

18. The method of claim 16, wherein the act of patterning the stack comprises forming a layer of photoresist on the protective layer.

19. The method of claim 18, wherein the act of patterning the stack comprises exposing the photoresist to a TMAH containing photo developer.

20. The method of claim 18, further comprising the act of removing the photoresist using a wet acid process.

21. The method of claim 18, further comprising the act of removing the photoresist using a dry strip process.

22. The method of claim 18, further comprising the act of removing the photoresist using a scrub process.

23. The method of claim 16, further comprising the act of performing photolithographic rework subsequent to the act of etching.

24. The method of claim 16, wherein the act of forming the protective layer comprises forming a layer of tungsten.

25. The method of claim 16, wherein the act of forming the protective layer comprises forming a composite layer of tungsten/tantalum nitride.

26. The method of claim 16, wherein the act of forming the protective layer comprises forming the protective layer having a thickness between approximately 50 Å to approximately 500 Å.

27. The method of claim 16, wherein the act of etching comprises performing a halogen containing reactive ion etch process.

28. The method of claim 16, wherein the act of etching comprises performing an argon sputter etch process.

29. The method of claim 16, wherein the metal containing layer and the chalcogenide material layer are a same layer.

30. A method of fabricating resistance variable memory elements, the method comprising:
    forming a first electrode over a substrate;
    forming a stack of layers by:
        forming a first layer of $Ge_xSe_{100-x}$ over the first electrode;
        forming a layer of $Ag_2Se$ over the first layer of $Ge_xSe_{100-x}$;
        forming a second layer of $Ge_xSe_{100-x}$ over the layer of $Ag_2Se$;
        forming a layer of Ag over the second layer of $Ge_xSe_{100-x}$;
        forming a third layer of $Ge_xSe_{100-x}$ over the layer of Ag;
        forming a protective layer on the third layer $Ge_xSe_{100-x}$;
        patterning the stack and the protective layer using photolithographic processes; and
        subsequently etching the first layer of $Ge_xSe_{100-x}$, the $Ag_2Se$ layer, the second layer of $Ge_xSe_{100-x}$, the Ag layer, the third layer of $Ge_xSe_{100-x}$ and the protective layer.

31. The method of claim 30, wherein the act of forming the protective layer comprises forming a layer of a light blocking material.

32. The method of claim 30, wherein the act of forming the protective layer comprises forming a layer of a conductive material.

33. The method of claim 30, wherein the act of forming the protective layer comprises forming a layer of a material in which silver is substantially insoluble that is etchable when etching the stack.

34. The method of claim 30, wherein the act of forming the protective layer comprises forming a layer of tungsten.

35. The method of claim 34, wherein the act of forming the layer of tungsten comprises forming the layer of tungsten having a thickness between approximately 50 Å and approximately 500 Å.

36. The method of claim 30, wherein the act of forming the first layer of $Ag_2Se$ comprises forming the first layer of $Ag_2Se$ such that the ratio of the layer of $Ag_2Se$ thickness to the first layer of $Ge_xSe_{100-x}$ thickness is between approximately 5:1 and approximately 1:1.

37. The method of claim 30, wherein the act of forming the first layer of $Ge_xSe_{100-x}$ comprises forming the first layer of $Ge_xSe_{100-x}$ having a thickness between approximately 100 Å and 1000 Å.

38. The method of claim 30, wherein the act of forming the second layer of $Ge_xSe_{100}$-x comprises forming the second layer of $Ge_xSe_{100}$-x having a thickness between approximately 100 Å and 1000 Å.

39. The method of claim 30, further comprising forming a second electrode on the tungsten layer subsequently to the act of etching the stack and the tungsten layer.

40. The method of claim 39, wherein the act of forming the second electrode comprises forming the second electrode such that it is common to a plurality of memory elements.

41. The method of claim 30, wherein the act of forming the first electrode comprises forming the first electrode such that it is common to a plurality of memory elements.

42. A method of fabricating resistance variable memory elements, the method comprising:
    forming a first electrode over a substrate;
    forming a stack of layer by:
        forming a first layer of $Ge_xSe_{100-x}$ over the first electrode;
        forming a layer of $Ag_2Se$ over the first layer of $Ge_xSe_{100-x}$;
        forming a second layer of $Ge_xSe_{100-x}$ over the layer of $Ag_2Se$;
        forming a layer of Ag over the second layer of $Ge_xSe_{100-x}$;
        forming a third layer of $Ge_xSe_{100-x}$ over the layer of Ag;
        forming a protective layer on the third layer $Ge_xSe_{100-x}$;
        forming a layer of photoresist on the protective layer;
        exposing portions of the layer of photoresist to light;
        developing the layer of photoresist;
        subsequently etching the first layer of $Ge_xSe_{100-x}$, the $Ag_2Se$ layer, the second layer of $Ge_xSe_{100-x}$, the Ag layer, the third layer of $Ge_xSe_{100}$-and the protective layer to form a pillar structure;
        removing the layer of photoresist; and
        forming a second electrode on the protective layer, the second electrode being common to a plurality of memory elements.

43. The method of claim 42, wherein the act of forming the protective layer comprises forming a layer of a light blocking, conductive material in which silver is substantially insoluble that is etchable when etching the stack.

44. The method of claim 42, wherein the act of forming the protective layer comprises forming a layer of tungsten.

45. The method of claim 44, wherein the act of forming the layer of tungsten comprises forming the layer of tungsten having a thickness between approximately 50 Å and approximately 100 Å.

* * * * *

UNITED STATES PATENT AND TRADEMARK OFFICE
CERTIFICATE OF CORRECTION

PATENT NO. : 7,098,068 B2  Page 1 of 2
APPLICATION NO. : 10/796109
DATED : August 29, 2006
INVENTOR(S) : Joseph F. Brooks It is certified that error appears in the above-identified patent and that said Letters Patent is hereby corrected as shown below:

In the Title Page (56) Other Publications portion of the References Cited section, the PTO made the following errors to be corrected:

"Afifi, M.A.; Labib, H.H.; Fouad,A.A.; Electrical & thermal conductivity of the amorphous semiconductor $Ge_xSe_{1-x}$, Egypt. J. Phys. 17 (1986) 335-342."

Should read

--Afifi, M.A.; Labib, H.H,; Fouad, S.S.; El-Shazly, A.A., Electrical & thermal conductivity of the amorphous semiconductor $Ge_xSe_{1-x}$, Egypt J. Phys. 17 (1986) 335-342.--;

"Fischer-Colbrie, A.; Bienenstock, A.; Fuoss, P.H.; Marcus, M.A., Structure and bonding in photodiffuses amorphous $Ag-GeSe_2$ thin films, Phys. Rev. B 38 (1988) 12388-12403."

Should read

--Fischer-Colbrie, A.; Bienenstock, A.; Fuoss, P.H.; Marcus, M.A., Structure and bonding in photodiffused amorphous $Ag-GeSe_2$ thin films, Phys. Rev. B 38 (1988) 12388-12403.--;

"Gates, B.; Wu, Y.; Y.; Yang, P.; Xia, Y., Single-crystalline nanowires of $Ag_2Se$ can be synthesized by templating against nanowires of trigonal Se, J. Am. Chem. Soc. (2001) currently ASAP."

Should read

--Gates, B.; Wu, Y.; Yin, Y.; Yang, P.; Xia, Y., Single-crystalline nanowires of $Ag_2Se$ can be synthesized by templating against nanowires of trigonal Se, J. Am. Chem. Soc. (2001) currently ASAP.--; and "Mitkiva, M.; Kozicki, M.N., Silver incorporation in Ge-Se glasses used in programmable metallization cell devices, J. Non-Cryst. Solids 299-302 (2002) 1023-1027."

Should read

--Mitkova, M.; Kozicki, M.N., Silver incorporation in Ge-Se glasses used in programmable metallization cell devices, J. Non-Cryst. Solids 299-302 (2002) 1023-1027.--.

UNITED STATES PATENT AND TRADEMARK OFFICE
CERTIFICATE OF CORRECTION

PATENT NO. : 7,098,068 B2
APPLICATION NO. : 10/796109
DATED : August 29, 2006
INVENTOR(S) : Joseph F. Brooks It is certified that error appears in the above-identified patent and that said Letters Patent is hereby corrected as shown below:

In the Claims, the following omissions are corrected:

Claim 42, column 10, line 32, "a layer" should read --a first layer--;

Claim 42, column 10, line 34, "the layer" should read --the first layer--; and

Claim 42, column 10, line 49, "$Ge_xSe_{100}$-" should read --$Ge_xSe_{100-x}$--.

Signed and Sealed this

Second Day of January, 2007

JON W. DUDAS
*Director of the United States Patent and Trademark Office*